United States Patent
Nakayama et al.

(10) Patent No.: US 7,014,830 B2
(45) Date of Patent: *Mar. 21, 2006

(54) METHOD FOR MASS-PRODUCING CARBON NANOCOILS

(75) Inventors: Yoshikazu Nakayama, 9-404, 14-2, Kongaoka 1-chome, Hirakata-city, Osaka 573-0084 (JP); Akio Harada, Osaka (JP)

(73) Assignees: Yoshikazu Nakayama, Osaka (JP); Daiken Chemical Co., Ltd., Osaka (JP)

( * ) Notice: Subject to any disclaimer, the term of this patent is extended or adjusted under 35 U.S.C. 154(b) by 591 days.

This patent is subject to a terminal disclaimer.

(21) Appl. No.: 10/192,090

(22) Filed: Jul. 10, 2002

(65) Prior Publication Data

US 2003/0010279 A1    Jan. 16, 2003

(30) Foreign Application Priority Data

Jul. 11, 2001   (JP) .............................. 2001-211277

(51) Int. Cl.
*D01F 9/12*   (2006.01)

(52) U.S. Cl. .................................. 423/447.3

(58) Field of Classification Search .............. 423/447.3
See application file for complete search history.

(56) References Cited

U.S. PATENT DOCUMENTS 6,558,645 B1 * 5/2003 Nakayama et al. ..... 423/445 B

* cited by examiner

Primary Examiner—Stuart Hendrickson
(74) Attorney, Agent, or Firm—Koda & Androlia

(57) ABSTRACT

A method for manufacturing carbon nanocoils that uses a reactor, including the steps of: heating an interior of the reactor, causing a hydrocarbon gas to flow in the reactor, dispersing an indium/tin/iron-based catalyst in a form of particles in the hydrocarbon gas, and allowing carbon nanocoils to grow on a surface of the catalyst while decomposing the hydrocarbon near the catalyst. The method can be comprised of the steps of: disposing a rotor inside a reactor, heating an area near the peripheral surface of the rotor, causing a hydrocarbon gas to flow in the reactor, coating a part of the peripheral surface of the rotor with an indium/tin/iron-based catalyst that is in a form of particles, allowing carbon nanocoils to grow on a surface of the catalyst coated on the rotating rotor, and collecting carbon nanocoils, which are grown during a rotation of the rotor, from the rotor.

5 Claims, No Drawings

METHOD FOR MASS-PRODUCING CARBON NANOCOILS

BACKGROUND OF THE INVENTION

1. Field of the Invention

The present invention relates to a method for manufacturing carbon nanocoils that comprise carbon atoms grown in a spiral form and have an outside diameter of 1000 nm or less and more particularly to a method for mass-producing carbon nanocoils that makes carbon nanocoils grow efficiently on a surface of catalyst by decomposing thermally hydrocarbon gas using indium/tin/iron-based catalyst.

2. Prior Art

In 1994 Amelinckx et al. (Amelinckx, X. B. Zhang, D. Bernaerts, X. F. Zhang, V. Ivanov, and J. B. Nagy, *Science*, 265 (1994), 635) succeeded at producing carbon nanocoils. Whereas the carbon microcoils that had been produced up to that point had an outside diameter on the micron order and furthermore were amorphous, it was revealed that the carbon nanocoils have a graphite structure. Various types of carbon nanocoils were produced thereafter, and the smallest coil diameter achieved was extremely small (about 12 nm). However, the coil yield remained so low that the process of manufacturing such carbon nanocoils was unfeasible for industrial production. Thus, there has been a need for a more efficient manufacturing method.

The above-mentioned manufacturing method involved the steps of forming a micropowder of a metal catalyst such as cobalt, iron or nickel, heating the area near this catalyst to between 600 and 700° C., and sending an organic gas such as acetylene or benzene through the manufacturing system so as to come into contact with the catalyst. However, this method was not utilized industrially because of its extremely low coil yield.

In 1999 Li et al. (W. Li, S. Xie, W. Liu, R. Zhao, Y. Zhang, W. Zhou, and G. Wang, *J. Material Sci.*, 34 (1999), 2745) succeeded a new producing method of carbon nanocoils. They placed a catalyst in the center of a graphite sheet covered around its outer periphery with iron particles and heated the catalyst to 700° C. while passing a mixed gas of acetylene and nitrogen over the catalyst, so that carbon nanocoils were produced on the catalyst surface. Unfortunately, this manufacturing method also results in a coil yield so low as to be unfeasible for industrial production.

The development of a suitable catalyst is the key to raising the carbon nanocoil yield. In view of this, the inventors of the present application examined various catalysts in an effort to increase the carbon nanocoil yield and succeeded in obtaining a yield of 90% or higher by using, in particular, an indium/tin/iron-based catalyst. The results of this research were disclosed in Japanese Patent Application Laid-Open Nos. 2001-192204 and 2001-310130.

The inventions in such applications proved the effectiveness of an indium/tin/iron-based catalyst. What was needed next was the development of a method for mass-producing carbon nanocoils using this indium/tin/iron-based catalyst or in other words, a continuous production method.

SUMMARY OF THE INVENTION

Therefore, the object of the method for producing, or in particular mass-producing, carbon nanocoils of the present invention is to establish a specific usage form for an indium/tin/iron-based catalyst and to provide a method that grows carbon nanocoils at high density on the surface of a catalyst and collect the carbon nanocoils continuously.

The above object is accomplished by a unique process in a method for manufacturing carbon nanocoils that have carbon atoms grown in a spiral form and have an outside diameter of 1000 nm or less; and the process of the present invention, that uses a reactor, is comprised of the steps of:
heating an interior of the reactor,
causing a hydrocarbon gas to flow in an interior of the reactor,
dispersing an indium/tin/iron-based catalyst in a form of particles in the hydrocarbon gas, and
allowing carbon nanocoils to grow on a surface of the catalyst while decomposing the hydrocarbon near the catalyst.

In the above method, the indium/tin/iron-based catalyst is sprayed and dispersed in a form of particles in the interior of the reactor, allowing the carbon nanocoils to grow on a surface of particles of the catalyst while the particles of the catalyst falling down, and collecting the particles of the catalyst, which are falling down, at a lower part of the reactor.

The above object is accomplished by another unique process in a method for manufacturing carbon nanocoils that have carbon atoms grown in a spiral form and have an outside diameter of 1000 nm or less; and the process of the present invention, that uses a reactor, is comprised of the steps of:
disposing a rotor inside a reactor,
heating an area near a peripheral surface of the rotor,
causing a hydrocarbon gas to flow inside the reactor,
coating a part of the peripheral surface of the rotor with an indium/tin/iron-based catalyst that is in a form of particles,
allowing carbon nanocoils to grow on a surface of the catalyst coated on the rotating rotor, and
collecting carbon nanocoils, which are grown during a rotation of the rotor, from the rotor.

In the above method, the rotor is a cylinder, the cylinder is rotated around an axis thereof, and the particles of the catalyst are applied on the surface of the cylinder in an axial direction of the cylinder.

In the present invention, the indium/tin/iron-based catalyst is in a form of particles dispersed in an organic solvent.

DETAILED DESCRIPTION OF THE INVENTION

As a result of diligent research into the large-scale synthesis of carbon nanocoils, the inventors had already discovered that an indium/tin/iron-based catalyst is extremely effective as a catalyst for this synthesis. Subsequent investigation led to the discovery of the method of the present invention for the improved mass production of carbon nanocoils by dispersing the indium/tin/iron-based catalyst in the form of particles so as to increase their surface area, thus producing the carbon nanocoils on the expanded catalyst surface.

The indium/tin/iron-based catalyst used in the present invention can be manufactured by a variety of methods.

In the first method, an organic solution is formed by mixing an indium-containing organic compound, a tin-containing organic compound, and an iron-containing organic compound in an organic solvent; a substrate is coated with this organic solution and the coating is dried to form an organic film; the organic film is baked so as to form an indium/tin/iron film; and then the indium/tin/iron film is shaved off in the form of particles to form catalyst particles.

In the second method, an organic solution is formed by dispersing an indium-containing organic compound and a tin-containing organic compound in an organic solvent; a substrate is coated with this organic solution to form an organic film; the organic film is baked to form an indium/tin film; an iron film is formed on the surface of this indium/tin film; and the resulting film is shaved off in the form of particles to form catalyst particles. The indium/tin film encompasses a mixed film of an indium oxide and a tin oxide.

In the third method, an organic solution is formed by mixing an indium-containing organic compound, a tin-containing organic compound, and an iron-containing organic compound in an organic solvent; this organic solution is sprayed into a baking furnace to form organic particles; the organic particles are heated as they fall through the baking furnace so as to remove the organic component; thus allowing indium/tin/iron-based catalyst particles to be deposited below.

In the fourth method, a ternary alloy of indium, tin, and iron is formed from metallic indium, metallic tin, and metallic iron; this ternary alloy is melted; and the molten alloy is sprayed in the form of particles, thus allowing particles to cool as they fall and to be collected as catalyst particles.

Known organometal compounds can be used for the above indium-containing organic compound, tin-containing organic compound, and iron-containing organic compound. Examples include trimethylindium, triphenylindium, indium octylate, indium carboxylate, triethyltin, trimethyltin, tetraphenyltin, tin octylate, tin carboxylate, iron carboxylate, iron carbonyl, iron carbonyl derivatives, iron nitrosil, and iron nitrosil derivatives. In addition to these, various known organometal complexes and so forth can also be used. Organometal compounds that are soluble in organic solvents are particularly useful.

As to the organic solvent, any known organic solvent such as acetone, toluene, benzene, or alcohol can be used. Organic solvents in which an indium-containing organic compound, tin-containing organic compound, and iron-containing organic compound can be dissolved or dispersed are particularly useful.

The present invention is characterized in that a hydrocarbon gas is flowed in a reactor, and an indium/tin/iron-based catalyst is dispersed in the form of particles in this hydrocarbon gas, thus allowing carbon nanocoils to grow on the surface of the catalyst particles while the hydrocarbon is dissolved in the vicinity of the catalyst.

In a specific example of dispersing the catalyst particles, the indium/tin/iron-based catalyst is dispersed by being sprayed in the form of particles into the interior of a reactor, thus allowing carbon nanocoils to grow on the surface of the falling catalyst particles; and the fallen catalyst particles are collected at the lower part (for example, at the bottom) of the reactor.

More specifically, the indium/tin/iron-based catalyst particles are dispersed in an organic solvent, and this catalyst dispersion solution is sprayed into the reactor. This spraying widely disperses the minute mist droplets inside the reactor, and the organic solvent is evaporated by heat within the reactor. As a result, the surface of the catalyst particles, which have a large surface area, comes into contact with the hydrocarbon gas in a high-temperature atmosphere.

The hydrocarbon is decomposed on the catalyst particle surface, and carbon nanocoils grow on this catalyst particle surface. The catalyst particles fall steadily, during which carbon nanocoils grow at a high density, and the catalyst particles are deposited in a receptacle at the bottom of the reactor. The carbon nanocoils are scraped off from these catalyst particles, and just the carbon nanocoils are obtained.

It will be understood that since the catalyst is in the form of particles, the surface area thereof is much larger than that of a flat catalyst. The smaller the particle diameter, the greater the surface area. Since the carbon nanocoils are grown at high density on this surface, they can be manufactured in a larger quantity than with a flat catalyst. Also, because the disperse-spraying of the catalyst particles is carried out continuously in the reactor, carbon nanocoils can be industrially mass-produced.

The invention provides another method that differs from the one described above.

In this another method of the present invention, a rotor is disposed inside a reactor, the area near the peripheral surface of the rotor is heated, a hydrocarbon gas is flowed (for instance, circulated) in the interior of the reactor, a part of the peripheral surface of the rotor is coated with particles of an indium/tin/iron-based catalyst, thus allowing carbon nanocoils to grow on the catalyst surface of the rotor while it is rotating, and the carbon nanocoils grown during this rotation of the rotor are collected from the rotor.

In this method, the work of applying the catalyst and collecting the carbon nanocoils is performed continuously while the rotor is rotating. More specifically, catalyst particles that have been dispersed in an organic solvent are sprayed onto the surface at the lower portion of the rotor so as to coat a predetermined surface area with the catalyst particles. As the rotor rotates, carbon nanocoils grow on the catalyst surface, and such nanocoils are scraped off with, for instance, a scraper and recovered during this rotation. The carbon nanocoils can be collected by a variety of different manners including suction or blowing-off.

Since the catalyst is also scraped off by the scraper, more catalyst is sprayed on at the stage when the catalyst-coated side of the rotor, that is rotating about a horizontal axis thereof, comes down to the bottom position. Since the rotor rotates inside the reactor and a hydrocarbon gas is flowing in the reactor, the application of the catalyst and the collecting of the carbon nanocoils can be carried out simultaneously, and the continuous performance of this operation allows carbon nanocoils to be mass-produced.

A cylinder, for instance, is used as the rotor. The cylinder is rotated around an axis thereof, the surface of the cylinder is coated with catalyst particles in the axial direction, and the scraper also is brought into contact with the cylinder surface in the axial direction. The quantity of carbon nanocoils that can be produced will be larger in proportion to the axial length of the cylinder.

EXAMPLES

Example 1

Producing Carbon Nanocoils on the Surface of Sprayed Catalyst Particles 8.1 g of indium octylate, 0.7 g of tin octylate, and 0.7 g of iron octylate were mixed in 100 mL of toluene and then uniformly dissolved by ultrasonic stirring. This organic solution was sprayed onto a sheet of glass and air-dried with a fan to form an organic film. This glass sheet was left for 30 minutes in a 450° C. heating furnace to bake the organic film, thus pyrolyzing the organic component and forming a film of indium/tin/iron-based catalyst.

This catalyst film was scraped off with a scraper and made into a micropowder in a mortar. The particle size of the powder was approximately 7 $\mu$m as measured by optical microscope. 2.7 g of the catalyst particles of this micropowder was dispersed in 100 mL of toluene to form a catalyst solution.

A quartz tube was installed vertically so as to constitute a reaction furnace, and this reactor was filled with helium gas. The full length of the reactor was heated to about 700° C.; after which one-third of the helium gas was replaced with acetylene, and the mixed gas was sent through at a flux of 250 sccm.

The above-described catalyst solution is sprayed from above this reactor and allowed to fall down through the furnace as slowly as possible. A receiving tray is placed at the bottom of the furnace to catch the fallen catalyst particles. A rising gas flow or counter-current may be formed in the reactor in order to make the particles descend even more slowly.

The catalyst particles were observed with a scanning electron microscope, which revealed that numerous carbon nanocoils had grown on the surface of the catalyst particles. This means that carbon nanocoils can be synthesized in large quantity on the surface of catalyst particles with the method described above.

Example 2

Producing Carbon Nanocoils on the Surface of a Rotating Cylinder

A quartz tube was installed horizontally so as to constitute a reaction furnace, and a quartz rotating cylinder was installed horizontally in this reactor. This rotating cylinder was set to be rotated extremely slowly in the reactor by means of external power.

The reactor is provided with an opening in the bottom portion, and such an opening extends in the direction of the axis of the tube-shaped reactor; and the rotating cylinder is set so that a part of its outer peripheral surface was exposed to the outside of the opening. Then, the reactor was filled with helium gas, and the surface of the rotating cylinder in the interior of the reactor was heated to about 700° C.; after which one-third of the helium gas was replaced with acetylene, and the mixed gas was sent through at a flux of 250 sccm.

The rotating cylinder was set so that it will take 20 minutes for one rotation, and the surface of the rotating cylinder exposed at the bottom opening was coated with the same catalyst solution as in Example 1. After one rotation of the rotating cylinder, the catalyst surface exposed through the opening was scraped off with a scraper.

The scraped-off catalyst particles were observed with a scanning electron microscope, which revealed that carbon nanocoils had grown at a high density on the surface of the catalyst particles. This means that carbon nanocoils can be synthesized in large quantity on the surface of catalyst particles with this method.

The present invention is not limited to the above embodiments and examples. Within the scope of the technological concept of the present invention, various variation examples, design modifications and so forth are encompassed within this technological scope of the present invention.

As seen from the above, according to the present invention, an indium/tin/iron-based catalyst is dispersed in the form of particles in a hydrocarbon gas, thus allowing carbon nanocoils to be grown on the surface of the catalyst particles. Thus, carbon nanocoils can be mass-produced on an industrial scale by performing this dispersion of catalyst particles continuously.

In addition, according to the present invention, an indium/tin/iron-based catalyst is dispersed by being sprayed in the form of particles into a reactor, carbon nanocoils are grown on the surface of the falling catalyst particles, and the fallen catalyst particles are collected at the lower part of the reactor. Thus, by carrying out this spraying and recovery continuously, a method for mass-producing carbon nanocoils can be realized.

Furthermore, in the present invention, the surface of a rotor is coated with indium/tin/iron-based catalyst particles, carbon nanocoils are grown inside a reactor, and these carbon nanocoils are collected from the rotor while the rotor is rotated. Accordingly, carbon nanocoils can be mass-produced by carrying out the catalyst particle coating and the recovery of carbon nanocoils continuously.

In the present invention, a cylinder is used as the rotor, this cylinder is rotated around the axis thereof, and the surface of the cylinder is coated with catalyst particles in the axial direction. Accordingly, the carbon nanocoils can be produced in a larger quantity in proportion to the axial length of the cylinder.

Furthermore, in the present invention, catalyst particles dispersed in an organic solvent are used as the indium/tin/iron-based catalyst. Accordingly, by way of spraying or otherwise coating this catalyst solution, it is possible to realize a mass production of carbon nanocoils.

What is claimed is:

1. A method for manufacturing carbon nanocoils having carbon atoms grown in a spiral form and having an outside diameter of 1000 mn or less, said method, which uses a reactor, comprising the steps of:
   heating an interior of said reactor,
   causing a hydrocarbon gas to flow in an interior of said reactor,
   dispersing an indium/tin/iron-based catalyst in a form of particles in said hydrocarbon gas, and
   allowing carbon nanocoils to grow on a surface of said catalyst while decomposing said hydrocarbon near said catalyst.

2. The method for manufacturing carbon nanocoils according to claim 1, wherein said indium/tin/iron-based catalyst is sprayed and dispersed in a form of particles in said interior of said reactor, allowing said carbon nanocoils to grow on a surface of particles of said catalyst while said particles of said catalyst falling down, and collecting said particles of said catalyst, which are falling down, at a lower part of said reactor.

3. A method for manufacturing carbon nanocoils having carbon atoms grown in a spiral form and having an outside diameter of 1000 nm or less, said method, which uses a reactor, comprising the steps of:
   disposing a rotor inside a reactor,
   heating an area near a peripheral surface of said rotor,
   causing a hydrocarbon gas to flow inside said reactor,
   coating a part of said peripheral surface of said rotor with an indium/tin/iron-based catalyst that is in a form of particles,
   allowing carbon nanocoils to grow on a surface of said catalyst coated on said rotating rotor, and
   collecting carbon nanocoils, which are grown during a rotation of said rotor, from said rotor.

4. The method for manufacturing carbon nanocoils according to claim 3, wherein said rotor is a cylinder, said cylinder is rotated around an axis thereof, and said particles of said catalyst are applied on a surface of said cylinder in an axial direction of said cylinder.

5. The method for manufacturing carbon nanocoils according to claim 1, 2, 3 or 4, wherein said indium/tin/iron-based catalyst is in a form of said particles dispersed in an organic solvent.

* * * * *

UNITED STATES PATENT AND TRADEMARK OFFICE
CERTIFICATE OF CORRECTION

PATENT NO. : 7,014,830 B2  Page 1 of 1
APPLICATION NO. : 10/192090
DATED : March 21, 2006
INVENTOR(S) : Yoshikazu Nakayama et al.

It is certified that error appears in the above-identified patent and that said Letters Patent is hereby corrected as shown below:

On the Title Page,

Item [75] Inventors:

Change "Yoshikazu Nakayama, 9-404, 14-2, Kongaoka 1-chome, Hirakata-city, Osaka 573-0084 (JP)" to --YOSHIKAZU NAKAYAMA, 9-404, 14-2, KORIGAOKA 1-CHOME, HIRAKATA-CITY, OSAKA 573-0084 (JP)--

Signed and Sealed this

Twenty-first Day of April, 2009

JOHN DOLL
*Acting Director of the United States Patent and Trademark Office*